(12) United States Patent
Nitschke et al.

(10) Patent No.: US 8,735,767 B2
(45) Date of Patent: May 27, 2014

(54) RESPONDING TO ARC DISCHARGES

(75) Inventors: Moritz Nitschke, Freiburg (DE);
Gerhard Zaehringer, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 1579 days.

(21) Appl. No.: 11/956,584

(22) Filed: Dec. 14, 2007

(65) Prior Publication Data

US 2008/0257869 A1 Oct. 23, 2008

(30) Foreign Application Priority Data

Dec. 14, 2006 (EP) .................................. 06025908

(51) Int. Cl.
*B23K 9/00* (2006.01)

(52) U.S. Cl.
USPC ................................ 219/121.54; 219/121.36

(58) Field of Classification Search
USPC ............. 219/121.36, 121.38, 121.43, 121.54, 219/121.59; 204/192.1, 192.13, 192.32; 702/57
See application file for complete search history.

(56) References Cited

U.S. PATENT DOCUMENTS

| | | |
|---|---|---|
| 4,031,464 A | 6/1977 | Norberg |
| 4,396,478 A | 8/1983 | Aizenshtein et al. |
| 4,588,952 A | 5/1986 | Matsuoka |
| 4,625,283 A | 11/1986 | Hurley |
| 4,629,940 A | 12/1986 | Gagne et al. |
| 4,694,402 A | 9/1987 | McEachern et al. |
| 4,936,960 A | 6/1990 | Siefkes et al. |
| 5,192,894 A | 3/1993 | Teschner |
| 5,241,152 A | 8/1993 | Anderson et al. |
| 5,543,689 A | 8/1996 | Ohta et al. |
| 5,576,939 A | 11/1996 | Drummond |
| 5,611,899 A | 3/1997 | Maass |
| 5,698,082 A | 12/1997 | Teschner et al. |
| 5,718,813 A | 2/1998 | Drummond et al. |
| 5,729,145 A | 3/1998 | Blades |
| 5,804,975 A | 9/1998 | Alers et al. |
| 5,889,391 A | 3/1999 | Coleman |
| 5,993,615 A | 11/1999 | Abry et al. |
| 6,007,879 A | 12/1999 | Scholl |
| 6,060,837 A | 5/2000 | Richardson et al. |

(Continued)

FOREIGN PATENT DOCUMENTS

| | | |
|---|---|---|
| DE | 4127504 | 2/1993 |
| DE | 43 26 100 | 2/1995 |

(Continued)

OTHER PUBLICATIONS

Translation of Office Action from correspondence Japanese Application No. 2007-504279, dated Sep. 28, 2009, 4 pages.

(Continued)

*Primary Examiner* — Brian Jennison
(74) *Attorney, Agent, or Firm* — Fish & Richardson P.C.

(57) ABSTRACT

For responding to an arc discharge in a plasma process (PP), a parameter of the plasma process is monitored to detect arc discharges occurring in the plasma. After detection of an arc discharge, a first countermeasure for the suppression of arc discharges is executed. After completion of the first countermeasure, a delay time period is allowed to elapse before the parameter is rechecked. In the event that after conclusion of the variable delay time period an arc discharge is detected, a second countermeasure for the suppression of arc discharges is executed.

37 Claims, 3 Drawing Sheets

(56) References Cited

U.S. PATENT DOCUMENTS

| | | |
|---|---|---|
| 6,063,245 A | 5/2000 | Frach et al. |
| 6,162,332 A | 12/2000 | Chiu |
| 6,213,050 B1 | 4/2001 | Liu et al. |
| 6,222,321 B1 | 4/2001 | Scholl et al. |
| 6,332,961 B1 | 12/2001 | Johnson et al. |
| 6,416,638 B1 | 7/2002 | Kuriyama et al. |
| 6,420,863 B1 | 7/2002 | Milde et al. |
| 6,472,822 B1 | 10/2002 | Chen et al. |
| 6,535,785 B2 | 3/2003 | Johnson et al. |
| 6,545,420 B1 | 4/2003 | Collins et al. |
| 6,621,674 B1 | 9/2003 | Zahringer et al. |
| 6,633,017 B1 | 10/2003 | Drummond et al. |
| 6,736,944 B2 | 5/2004 | Buda |
| 6,740,207 B2 | 5/2004 | Kloeppel et al. |
| 6,753,499 B1 | 6/2004 | Yasaka et al. |
| 6,783,795 B2 | 8/2004 | Inoue et al. |
| 6,791,274 B1 | 9/2004 | Hauer et al. |
| 6,859,042 B2 | 2/2005 | Parker |
| 6,878,248 B2 | 4/2005 | Signer et al. |
| 6,943,317 B1 | 9/2005 | Ilic et al. |
| 6,967,305 B2 | 11/2005 | Sellers |
| 7,016,172 B2 | 3/2006 | Escoda |
| 7,081,598 B2 | 7/2006 | Ilic et al. |
| 7,262,606 B2 | 8/2007 | Axenbeck et al. |
| 7,301,286 B2 | 11/2007 | Kuriyama |
| 7,408,750 B2 | 8/2008 | Pellon et al. |
| 2004/0031699 A1 | 2/2004 | Shoji |
| 2004/0079733 A1 | 4/2004 | Kawaguchi et al. |
| 2004/0182697 A1 | 9/2004 | Buda |
| 2004/0212312 A1 | 10/2004 | Chistyakov |
| 2005/0051270 A1 | 3/2005 | Sasaki et al. |
| 2005/0093459 A1 | 5/2005 | Kishinevsky |
| 2005/0135025 A1 | 6/2005 | Escoda |
| 2006/0011473 A1 | 1/2006 | Kuriyama et al. |
| 2006/0049831 A1* | 3/2006 | Anwar et al. ............... 324/536 |
| 2006/0054601 A1 | 3/2006 | Ilic et al. |
| 2006/0100824 A1 | 5/2006 | Moriya |
| 2006/0181816 A1 | 8/2006 | Pellon et al. |
| 2006/0213761 A1 | 9/2006 | Axenbeck et al. |
| 2007/0073498 A1 | 3/2007 | Winterhalter et al. |
| 2007/0121267 A1 | 5/2007 | Kotani et al. |
| 2007/0168143 A1 | 7/2007 | Axenbeck et al. |
| 2007/0251813 A1 | 11/2007 | Ilic et al. |
| 2008/0121517 A1 | 5/2008 | Nitschke |
| 2008/0121625 A1 | 5/2008 | Zaehringer |
| 2008/0122369 A1 | 5/2008 | Nitschke |
| 2008/0133154 A1 | 6/2008 | Krauss |
| 2008/0216745 A1 | 9/2008 | Wiedemuth et al. |
| 2008/0218923 A1 | 9/2008 | Wiedemuth |

FOREIGN PATENT DOCUMENTS

| | | |
|---|---|---|
| DE | 44 20 951 | 12/1995 |
| DE | 19651615 | 7/1997 |
| DE | 19849636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1705687 | 9/2006 |
| EP | 1720195 | 11/2006 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO2006116445 | 11/2006 |

OTHER PUBLICATIONS

Ochs et al., "Advanced Power Supplies designed for Plasma Deposition and Etching", Vakuum in Forschung und Praxis, vol. 8, No. 5, Sep. 26, 2006, pp. 32-36.

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

International Search Report from corresponding European Application No. 06 02 5908, mailed May 18, 2007, with translation, 13 pages.

\* cited by examiner

RESPONDING TO ARC DISCHARGES

CROSS REFERENCE TO RELATED APPLICATION

This application claims priority under 35 U.S.C. §119(a) from EP Application No. 06 025 908.2, filed Dec. 14, 2006, the entire contents of which are hereby incorporated by reference.

TECHNICAL FIELD

The invention relates to responding to arc discharges and, in particular, to responding to arc discharges in a plasma process by monitoring a parameter of the plasma process.

BACKGROUND

Plasma processes occur, for example, in plasma treatment and coating devices. Plasma can furthermore be used in etching or ashing processes. A very common plasma process is sputtering, in which accelerated ions from the plasma remove atoms from a target, and the atoms are then deposited on a substrate. For depositing compounds, such as, e.g., $Al_2O_3$, on the substrate, one often adds reactive gases when sputtering. This type of sputtering is called reactive sputtering.

In reactive sputtering, insulating layers also can be formed on the target. The ions that are accelerated onto the target can charge such insulating layers. If the field strength of an insulating layer that has been charged in this manner exceeds the breakdown field strength, arc discharges or arcs are formed. Arcs can be short-lived and self-extinguishing (such arcs can be referred to as short or micro arcs), or arcs can endure for a long time and have very high energy (such arcs can be referred to as hard arcs). Short arcs for the most part cause only a very small amount of damage and can be allowed to occur for many processes (e.g., glass coating processes). Hard arcs can lead to the destruction of the target and to imperfections on the substrate. Therefore, hard arcs can be suppressed by appropriate countermeasures.

For example, when a hard arc occurs, the current supplied by the plasma power supply can be briefly interrupted to prevent more severe damage to the sputtering system. Alternatively, the voltage applied to the plasma chamber can also be short-circuited or reversed in polarity. To initiate the above cited measures for the suppression of arc discharges, devices for the detection of an arc discharge or an arc and for the extinction of arc discharges are necessary when supplying power to the plasma processes. Such devices often form an integral part of the plasma power supply.

Because an interruption of the plasma power supply or a reversal in polarity of the same negatively affects the performance of the plasma process, and because short arcs are self-extinguishing, it is customary not to initiate countermeasure in response to detecting only short arcs.

WO 2006/014212 A2 discloses a method for the detection and treatment of arc discharges, in which the flow of power in a plasma from a power supply is interrupted for a pre-set period of time and then restored. If subsequently an arc discharge is again detected, the flow of power is once again interrupted.

SUMMARY

In one general aspect of the invention, a method of responding to arc discharges occurring in a plasma process includes monitoring a parameter to determine whether an arc discharge is present. Upon determining that an arc discharge is present, a first arc countermeasure is executed and after completion of the first countermeasure, the monitored parameter is checked again to determine if the arc discharge is still present after a first delay time period. Then, upon determining that an arc discharge is present, a second arc countermeasure is executed.

In another aspect, a method of responding to arc discharges occurring in a plasma process includes performing the plasma process, monitoring a parameter of the plasma process for an arc discharge indication, upon a first indication that an arc discharge is present, executing a first arc countermeasure over a first countermeasure time period, after completion of the first countermeasure, checking the monitored parameter again for an arc discharge indication being present at the conclusion of a first delay time period, and upon a second indication that an arc discharge is present, executing a second arc countermeasure over a second countermeasure time period.

In another aspect, a plasma process arc discharge detection device for the detection of arc discharges in a plasma process using at least one parameter includes
a monitoring unit configured to monitor the at least one parameter of the plasma process and to generate and output a monitoring signal indicating detection of an arc discharge, and a control unit configured to initiate a first arc suppression countermeasure based on the monitoring signal. The control unit is further configured to initiate a second arc countermeasure based on the monitoring signal after conclusion of a first delay time period following a completion of the first arc countermeasure.

In another aspect, a plasma power supply to supply a plasma process includes such an arc discharge detection and the plasma power supply is controllable by a control unit of the arc discharge detection device.

Implementations may include one or more of the following features.

In some embodiments, the first arc countermeasure can differ from the second arc countermeasure.

In some embodiments, executing the first arc countermeasure can include performing an interruption or a reversal in polarity of a plasma power supply.

In some embodiments, the first arc countermeasure can be executed over a second time period. In some embodiments, the second arc countermeasure can be executed over a third time period. The third time period can be longer than the second time period.

In some embodiments, executing the second arc countermeasure can include performing an interruption or a reversal in polarity of a plasma power supply.

In some embodiments, no arc countermeasures can be executed over the first delay time period in response to any further detected arc discharges.

In some embodiments, the execution of any further first and/or second arc countermeasures can be suppressed over a respective fourth time period.

In some embodiments, the method can further include controlling the operation of a plasma power supply to change into an arc suppressing operation mode.

In some embodiments, the monitored parameter can be an electrical parameter of the plasma process.

In some embodiments, the first arc countermeasure and the second arc countermeasure can be executed by different arc discharge extinction circuits.

In some embodiments, the first arc countermeasure and the second arc countermeasure in each case can be executed after conclusion of a respective response time period from detection of an arc discharge.

In some embodiments, the first delay time period can be variable.

In some embodiments, the method further can include adjusting the first delay time period, the second time period, the third time period, the fourth time period, and the response time period(s) based an automated adjustment, an adjustment as a function of a process parameter of the plasma process, and/or an adjustment by a user. In some embodiments, the adjustment of one of time periods is done during operation of a plasma process. One of the time periods can be predetermined for special types of plasma processes or one of the time periods can be varied during different phases of a plasma process.

In some embodiments, the second time period can be adjustable between about 0.01 and about 10 µs in duration.

In some embodiments, the third time period can be adjustable to be longer than 10 µs.

In some embodiments, the control unit can be configured to adjust the first delay time period, for example, during operation based on at least one of an automated adjustment as a function of a process parameter of the plasma process and an adjustment by a user. The control unit can be further configured to output a first control signal to control the first arc countermeasure over a second time period. The control unit can also be configured to output the second control signal over a third time period.

In some embodiments, the control unit can be configured not to output the first control signal and/or the second control signal over a fourth time period.

In some embodiments, the control unit can be configured to adjust the fourth time period for the first and second arc countermeasures independently of each other.

In some embodiments, the monitoring unit is configured to monitor an electrical parameter of the plasma process.

In some embodiments, the arc discharge detection device further includes separate arc discharge extinction circuits to execute the first and second countermeasures.

In some embodiments, the control circuit can be configured to trigger the first and second arc countermeasures after conclusion of respective variable response time periods from detection of an arc discharge.

In some embodiments, the plasma power supply can be switchable to an off operation mode or can be reversible in polarity as a first arc countermeasure in response to a first control signal of the control unit over a second time period.

In some embodiments, the plasma power supply can be switchable to an off operation mode or is reversible in polarity as a second arc countermeasure in response to a second control signal of the control unit over a third time period.

In some embodiments, the method can include adjusting at least one of the first delay time period, the first countermeasure time period, and the second countermeasure time period based on at least one of an automated adjustment, an adjustment as a function of a process parameter of the plasma process, and an adjustment by a user.

The adjusting can be performed during the plasma process.

Responding to self-extinguishing arc discharges can help to improve quality in plasma processes, for example, the quality of a coating. Furthermore, responding to short arcs differently than to hard arcs, which naturally often require more severe countermeasures, can help to avoid requiring the plasma power supply to be inactive during inappropriate long periods of time, which can lead to an unacceptable reduction in throughput. Thus, some embodiments of the invention can help to satisfy increasing quality requirements without excessively impairing throughput.

In another aspect of the invention, in a method for the detection of arc discharges in a plasma process at least one parameter of the plasma process is monitored to detect arc discharges occurring in the plasma, and after detection of an arc discharge, a first countermeasure for the suppression of arc discharges is executed. After completion of the first countermeasure a variable delay time is allowed to elapse and then in the event that after elapse of the variable delay time an arc discharge is detected, a second countermeasure for the suppression of arc discharges is executed.

In another aspect of the invention, an arc discharge detection device to detect arc discharges in a plasma process with the aid of at least one parameter of the plasma process includes a monitoring unit to monitor the at least one parameter, which is designed to generate and output a monitoring signal in the event of detection of an arc discharge and a control unit that is designed so as to generate as a function of the monitoring signal at least one control signal to control a particular countermeasure for the suppression of the arc discharge.

Furthermore, the control unit is configured to allow a variable delay time to elapse after completion of a first countermeasure and to generate a control signal to control a second countermeasure after elapse of the variable delay time.

In another aspect of the invention, a plasma power supply includes an arc discharge detection device as described above, where the plasma power supply can be controlled by the control unit of the arc discharge detection device. Accordingly, the method for the detection of arc discharges can be applied to control the operation of a plasma power supply.

In this specification, the term "variable" is used to indicate that an appropriate value, such as a period of time, is not permanently prescribed or permanently set, but rather can be altered when executing a method or when using a device, be it automatically as a function of certain process parameters, or explicitly through input (control) of a user. It can be advantageous to offer to a user options for variable adjustment of times—such as, in particular, the delay time. Then, the user has the option of adapting the arc discharge detection better to his/her processes in many respects, and at the same time can maintain a high throughput and quality.

Thus, in one aspect of the invention for every detected arc discharge, i.e., also in the event of a self-extinguishing arc discharge, a first countermeasure for the suppression of arc discharges is actuated. Actuation of the first countermeasure can satisfy increasing requirements on the quality in plasma processes. However, a countermeasure of this kind can only be undertaken or initiated if previously a (self-extinguishing) arc discharge has been detected. Then, after completion of the first countermeasure, a variable delay time is allowed to elapse, so that in this manner differentiation can be made between short arcs and hard arcs. Then, according to the invention a response can be made with the second countermeasure to an arc that persists (hard arc). The variable delay time or delay time period is also designated as a "first period of time," which in some embodiments of the present invention can be automatically adjusted as a function of process parameters of the plasma process, or alternatively can be adjusted by a user.

In some embodiments of the invention, the first and second countermeasures can be designed with respect to their duration, intensity or similar for the purposes of extinguishing short arcs and hard arcs, respectively.

The monitored parameter can be an electrical parameter of the plasma process such as a voltage or a current intensity.

In some embodiments, one can control the first countermeasure according to the monitoring of a first parameter of the plasma process and the second countermeasure according to the monitoring of a second parameter of the plasma process that differs from the first parameter.

In some embodiments, an interruption or a reversal in polarity of the plasma power supply can be executed as a first countermeasure. The first countermeasure can, for example, be executed during a second period of time, which moreover can be variable in the same manner as the first period of time.

In some embodiments, the plasma power supply can be switched off or reversed in polarity during a certain period of time, for example, during the second period of time, as a first countermeasure compliant with the first control signal. The control unit of the arc discharge detection device can therefore output a first control signal to control the first countermeasure during a second period of time.

To ensure as small an impairment of the throughput of the plasma process as possible, the first countermeasure for the suppression/extinction of short arcs can be executed briefly, i.e., the second period of time can be between about 0.01 and about 10 µs.

In some embodiments, the second period of time can be adjustable and, for example, can be adjustable between about 0.01 and about 10 µs.

In some embodiments, an interruption or a reversal in polarity of the plasma power supply can be executed as a second countermeasure, where the second countermeasure can be executed during a third period of time. The third period of time can be longer than the second period of time, and, for example, longer than about 10 µs. The third period of time can be variable in the same manner as the first period of time and/or the second period of time.

In some embodiments, as a second countermeasure compliant with the second control signal, the plasma power supply can be switched off or reversed in polarity during a further predetermined period of time, for example, during the third period of time. The third period of time can be adjustable, for example, to values larger than the second period of time.

In some embodiments, no response is made to any further arc discharges detected during the delay time or first period of time. If further arc discharges occur, namely during the period of time after the detection of a first arc discharge and up to the conclusion of the first period of time, these arc discharges do not need to be taken into account. In the case that—as described above—the arc discharge still continues to be present after conclusion of the first period of time, one deals with the arc as a hard arc and suppresses the arc with an appropriately matched second countermeasure. If, however, the first arc discharge detected is no longer present after conclusion of the first period of time, the brief switch off or reversal of polarity provided (i.e. the first countermeasure) also cleans up all "irregularities" associated with any arc discharges that have occurred in the intermediate period of time.

To improve the processing capacity, in some embodiments no further first and/or second countermeasures are executed during a respective fourth period of time.

In some embodiments, the control unit can be configured not to regenerate the first control signal and/or the second control signal before the elapse of a respective fourth period of time. Then, the fourth period of time can be adjustable.

In some embodiments, the fourth period of time can be adjusted for the first and second countermeasures independently of each other. The adjustment of the fourth period of time or fourth periods of time can—as for the adjustment of the delay time (first period of time) and the second and third periods of time—happen either automatically as a function of process parameters of the plasma process, or by an input on of a user.

By prescribing and/or adjusting the fourth period(s) of time within which no response is made to a plurality of (additionally) detected arcs, one can adapt the throughput of the plasma process, and maybe even increase the throughput.

In some embodiments, the first and second measures are executed by different arc discharge extinction circuits. Correspondingly, in some embodiments, the arc discharge detection device has separate arc discharge extinction circuits to actuate the first and second countermeasures. Thus, it can be possible to achieve in hardware terms a response optimally adapted to different types of arc discharges.

In some embodiments, the first and second countermeasures can be executed in each case after elapse of a variable response time from detection of an arc discharge. In other words: in these embodiments, the countermeasure in question is not executed immediately on detection of an arc discharge, but rather only after elapse of the respective response time. In plasma processes, providing such an additional variable response time can be often beneficial in achieving an optimal treatment result.

In some embodiments of the arc discharge detection device, the control unit can be configured to trigger the first and second countermeasures in each case after elapse of a variable response time from detection of an arc discharge.

Furthermore, the response time in question can also be automatically adjustable as a function of process parameters of the plasma process, or can be adjustable by a user.

Further features and advantages of the invention ensue from the following description of examples of embodiment of the invention, with the aid of the figures of the drawing, which show individual details essential to the invention, and from the claims. The individual features can be put into effect in a variant of the invention either individually, or in a plurality of any kind of combination.

The details of one or more embodiments are set forth in the accompanying drawings and the description below. Other features, objects, and advantages will be apparent from the description and drawings, and from the claims.

DETAILED DESCRIPTION

Figure 1:
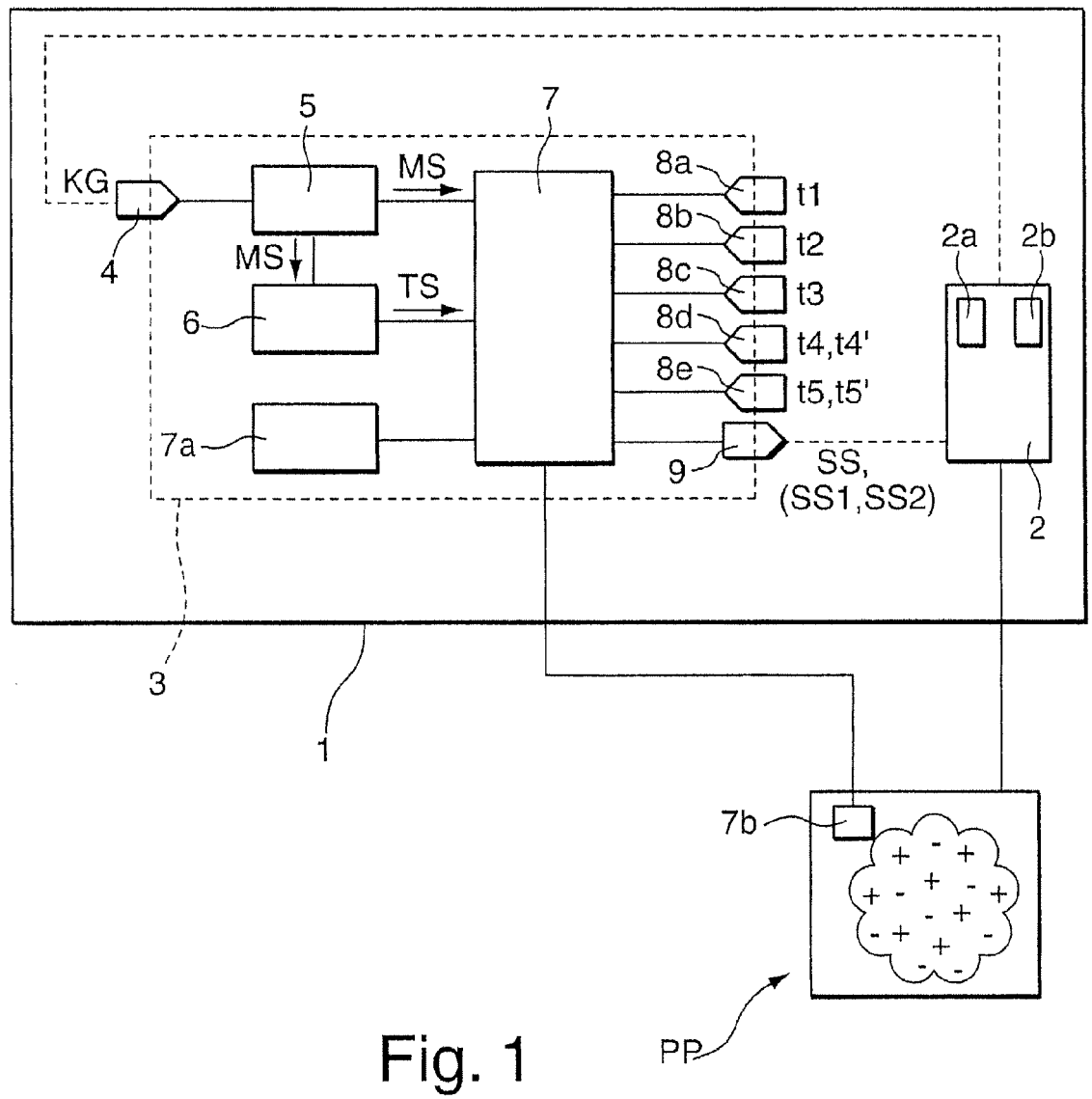
FIG. 1 is a block diagram of an embodiment of a power supply for a plasma process.

FIG. 1 shows a schematic block diagram of a power supply 1 for a plasma process (PP). The plasma power supply 1 includes a power source 2 for the supply of the plasma process PP with a DC voltage or AC voltage and an arc discharge detection device 3. Within the plasma power supply 1, the arc discharge detection device 3 interacts via signals with the power source 2 to detect arc discharges in the plasma process PP.

For this purpose, the arc discharge detection device 3 has a first input port 4 for an electrical parameter KG of the power source 2. The electrical parameter KG can be a voltage or a current or any suitable electrical parameter. For example, a voltage drop or an increase in current at the power source 2 can indicate that an arc discharge is taking place in the plasma process PP, or at least is in the process of evolving. The electrical parameter KG can be a power parameter, which is used for high-frequency (HF) plasma power supplies. For example, one can measure a forward power PI and a reverse power PR. One can also use an external parameter or combinations of parameters for arc discharge detection.

The power source 2 includes first and second arc discharge extinction circuits 2a, 2b, respectively, as described below.

The arc discharge detection device 3 also includes a monitoring unit 5, which is connected with the input port 4 via signal connections. In addition, the arc discharge detection device 3 has a timer unit 6 and a control unit 7. The control unit 7 interacts with a storage medium 7a, e.g., the control unit 7 can access the storage medium 7a. As shown in FIG. 1, the control unit 7 has inputs 8a-8e as well as an output 9. Via signal connections to the output port 9, the control unit 7 and thus the arc discharge detection device 3 are connected with the power source 2. Signal connections also exist between the monitoring unit 5 and the timer unit 6, between the monitoring unit 5 and the control unit 7, and between the timer unit 6 and the control unit 7.

The control unit 7 includes further a sensor arrangement 7b to determine the process parameters of the plasma process PP. Alternatively, the control unit 7 is functionally connected with such an arrangement to the plasma process PP. The sensor arrangement 7b can additionally, or alternatively, be used for detection of arc discharges. For this purpose, the sensor arrangement 7b can interact with the monitoring unit 5.

The monitoring unit 5 of the arc discharge detection device 3 is configured to monitor the electrical parameter of the power source 2 by comparison with a reference or threshold value (not shown). For example, the electrical parameter can be input at the input port 4. Thus, the monitoring unit 5 can be configured to detect a drop in the voltage of the power source 2 and/or a rise in the current of the power source 2 by comparison with an appropriate reference value, which accordingly indicates the presence or the evolution of an arc discharge in the plasma process. In the event of detecting an arc discharge, the monitoring unit 5 is furthermore configured to generate an appropriate monitoring signal MS, and, for example, to output that signal to the timer unit 6. Furthermore, in the event of detection of the arc discharge, the monitoring signal MS is also output to the control unit 7, as shown in FIG. 1.

In this description, the term "generation" of a signal is used, without any limitation of its generality, such that the signal is switched to a high logic state ("1") However, alternative signal forms can also be implemented. For example, the generation of a signal can involve switching to a low logic state. Signal generation will be discussed in connection with FIG. 2.

The timer unit 6 is, for example, configured to determine a period of time that has elapsed since generation of the monitoring signal MS by the monitoring unit 5, and to output the time signal TS to the control unit 7, as shown in FIG. 1. Thus, based on the monitoring signal MS of the monitoring unit 5 and the time signal TS of the timer unit 6, it is known to the control unit 7, whether and, if applicable, since when an arc discharge is taking place in the plasma process or is in the process of evolving.

The control unit 7 is configured to generate at least one control signal SS that depends on the supplied monitoring signal MS and on the time that has elapsed since detection of an arc discharge according to the time signal TS. The control signal is then output via the output port 9 to the power source 2 to control the plasma power supply 1 in respect of a relevant countermeasure for the suppression of the arc discharge. The control signal SS can, for example, take the form of a signal by means of which a switch-off or a reversal of polarity of the power source 2 can be effected to suppress (extinguish) an arc discharge detected in the plasma process. The arc discharge extinction circuits 2a, 2b can be used in the power source 2. Activated through the at least one control signal SS, the arc discharge extinction circuits 2a, 2b can cause the power source 2 to switch off or to reverse the polarity.

The timer unit 6 is furthermore configured to determine a period of time that has elapsed since generation of the at least one control signal SS by the control unit 7. Thus, it can be known whether and, if applicable, since when and/or until when countermeasures to suppress an arc discharge in the plasma process are being/have been triggered by means of the control unit 7. Alternatively, a unit that corresponds in function to the timer unit 6 can be directly integrated into the control unit 7.

To implement a reliable extinction both of self-extinguishing short arcs and also of non self-extinguishing hard arcs, without excessively impairing the throughput of the plasma process PP, the control unit 7 is configured to generate, for example, a first control signal SS1 for a first countermeasure, and to output the first signal via the output port 9 to the power source 2, i.e., to the first arc discharge extinction circuit 2a. The first signal is output as soon as the monitoring unit 5 outputs the monitoring signal MS that indicates the detection of an arc discharge. Preferably the first control signal SS1 is output only after conclusion of a prescribed first response time t5, which is indicated by the time signal TS of the timer unit 6. In other words: if the time signal TS of the timer unit 6 indicates the conclusion of a prescribed response time, the control unit 7 outputs the first control signal SS1 via the output port 9 to the power source 2, i.e., to the first arc discharge extinction circuit 2a, to actuate the first countermeasure. "Countermeasures" can include a switching off of the power source 2, i.e. an interruption of the plasma power supply, or a reversal in polarity of the power source 2 by an arc discharge extinction circuit 2a, 2b, which can extinguish the arc discharge even more efficiently.

The first response time t5 can be prescribed via the input port 8e of the arc discharge detection device 3, as shown in FIG. 1. For example, a user can define a first response time t5 through a suitable input unit (not shown). Alternatively, an adjustment of the first response time t5 can also be performed as a function of process parameters of the plasma process PP. Process parameters can be determined with the sensor arrangement 7b and transferred to the control unit 7. With the variable first response time t5 one can optimize a product of the plasma process PP. The fact that after conclusion of the first period of time the arc discharge detected previously by the monitoring signal MS is no longer present can indicate that the arc discharge detected was a self-extinguishing arc discharge, i.e., a short arc. The response to a short arc of this kind is made with an appropriate first countermeasure, further details of which are described in connection with FIG. 2.

The first countermeasure is executed during a second period of time t2, which can be prescribed (adjusted) via the input port 8b. Subsequently—after completion of the first countermeasure—the arc discharge detection device 3 according to the control unit 7 waits for a delay time t1, which can be adjusted via the input port 8a, before the parameter KG of the plasma process PP is rechecked with the monitoring unit 5. In the case that after the conclusion of the delay time t1 the control signal MS continues to indicate an arc discharge, i.e. MS=1, the control unit 7 (if necessary after elapse of a second response time t5'; see below) generates a second control signal SS2, which differs from the first control signal SS1, and outputs the second control signal SS via the output port 9 to the power source 2, i.e., to the second arc discharge extinction circuit 2b. The second control signal SS actuates a second countermeasure that differs from the first countermeasure. As discussed above, the second countermeasure is configured to suppress the arc discharge. In other words: if after elapse of the delay time t1 an arc discharge is still detected, one is probably dealing here with a non self-extinguishing hard arc, to which one responds with the special second countermeasure. The first and second countermeasures differ, for example, with regard to their respective time length of execution. For example, the second adjustable period of time t2, during which the first countermeasure is actuated by the control signal SS1, can be shorter than a third adjustable period of time t3, during which the second countermeasure is actuated by the control signal SS2.

Like the first countermeasure, the second countermeasure can be executed after conclusion of a corresponding second response time t5' to optimize a result of the plasma process PP. In other words: if an arc discharge has again been detected after the delay time t1 has passed, the control unit 7 generates the second control signal SS2 only after conclusion of the second response time t5'. Similar to the first reaction time t5, the second response time t5' can be automatically adjusted, or adjusted by a user, via the input port 8e.

The adjustable delay time or first period of time t1 and the adjustable second and third periods of time t2, t3—as already stated—can be input into the control unit 7 via the respective input ports 8a-8c as shown in FIG. 1, and can thus be preset. Alternatively, all of these times can also be automatically adjusted as a function of process parameters of the plasma process PP determined by the sensor arrangement 7b, as, e.g., described above.

A fourth input port 8d of the control unit 7 is shown in FIG. 1. Using the fourth input port 8d, other fourth periods of time t4, t4' can be input and preset, as described below in connection with FIG. 2. These and all other inputs mentioned above can be stored in the storage medium 7a, for example, together with basic settings provided as standard for the corresponding quantities. The storage medium 7a preferably takes the form of a non-volatile store, so that the corresponding inputs or settings remain stored even if the energy supply fails.

Figure 2:
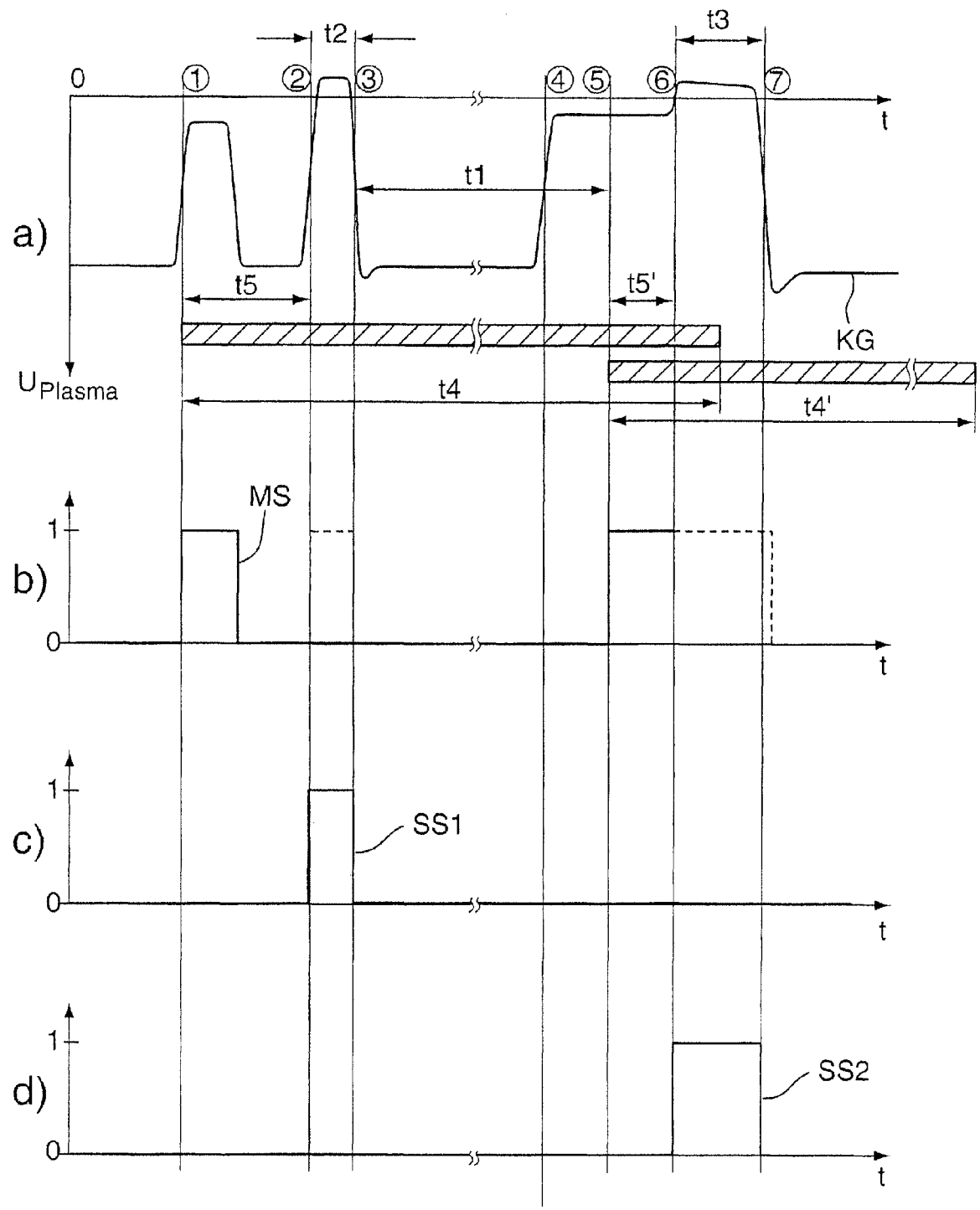
FIG. 2 is a time sequence diagram for signals within the plasma power supply from FIG. 1.

FIG. 2 shows time sequence diagrams for signals within the plasma power supply 1 of FIG. 1. FIG. 2 is divided into four parts a) to d). Part a) represents in an exemplary manner the signal characteristic of the electrical parameter KG (as shown in FIG. 1). Part b) represents a signal characteristic of the monitoring signal MS. Part c) represents a signal characteristic of the first control signal SS1 and part d) represents a signal characteristic of the second control signal SS2. In FIG. 2, t indicates time and $U_{Plasma}$ indicates a plasma voltage of the plasma process under consideration. The plasma voltage corresponds, for example, to a voltage supplied by a power source configured as the DC voltage source 2 of FIG. 1.

In FIG. 2, at time $\hat{1}$ a voltage drop occurs in the plasma process, which is caused by an arc discharge. In that case, the arc discharge is a short arc, which extinguishes itself again within a period of time t<t5, as shown in FIG. 2 in part a). In other words: before reaching the time $\hat{2}$, which marks the conclusion of the first response time t5, the monitoring signal MS changes from a high logic state MS=1 back to a low logic state MS=0. Nevertheless the control unit 7 responds with a reversal in polarity of the plasma voltage beginning at time $\hat{2}$ for a period of time t2, i.e., up to the point in time ③ by the first arc discharge extinction circuit 2a. Signal characteristics of the corresponding control signals can be seen in FIG. 2 in part b) and part c).

As shown in part a), shortly after the plasma voltage, drops at time $\hat{1}$, i.e., drops below a certain, not shown, voltage threshold, the monitoring unit 5 outputs the monitoring signal MS at a high logic state MS=1. At time $\hat{2}$, the first response time t5 has passed, so that the control unit 7 outputs the first control signal SS1=1 as shown in part c). This occurs during the second period of time t2, during which as shown in FIG. 2 a reversal in polarity of the plasma voltage is performed as a first countermeasure. This state continues up to the time $\hat{3}$, at which the control unit 7 switches the first control signal SS1 back to a low logic state SS1=0 as shown in part c).

In part b) of FIG. 2, a state of the monitoring signal MS is shown as a dashed line, while the first countermeasure for suppression of the arc discharge is in progress between the time $\hat{2}$ und the time $\hat{3}$. This part of the monitoring signal MS is, however, not relevant for the generation of the first control signal SS1. In other words: the control unit 7 should be programmed such that it does not respond with a renewed countermeasure in the case that the monitoring unit 5 signals an arc detection, i.e. MS=1, that is triggered by a countermeasure.

In the case that a short arc caused the plasma voltage drop, performing the first countermeasure was a sufficient response and the plasma voltage might not change at least for some time, specifically it is not dropped at the end of a first delay time period t1. That case corresponds to the left-hand part of FIG. 2 (without the signal characteristics of the right-hand part).

For a case in which the—at time $\hat{1}$—detected arc discharge is a non self-extinguishing hard arc, signal characteristics are shown in the right-hand part of FIG. 2. In that case, the first countermeasure—performed between the time $\hat{2}$ and the time $\hat{3}$—has not yet completely extinguished the arc discharge, so that a corresponding impairment of the plasma process PP and the result of the process might be caused.

As shown in part a) of FIG. 2, a second voltage drop occurs at a time $\hat{4}$ and continues at least up to a time $\hat{5}$, so that no self-contained extinction of the arc discharge is occurring. For hard arcs, often and in a deviation from the example shown in FIG. 2, the time $\hat{4}$ lies immediately after the time $\hat{3}$.

In part b) of FIG. 2, the corresponding shape of the monitoring signal MS of the monitoring unit 5 is shown. It can be seen that—upon rechecking of the parameter KG by the monitoring unit 5 after the delay time period t1—the monitoring signal MS at the time $\hat{5}$ is in a high logic state MS=1.

Deviating from the representation in FIG. 2, the monitoring unit 5 can already output a signal MS=1 at the time $\hat{4}$, although that monitoring signal MS is only evaluated by the control unit 7 at the time $\hat{5}$—depending on which of the two units (monitoring unit or control unit) is equipped with the necessary intelligence.

The first control signal SS1 is not activated at the time $\hat{5}$ but rather is held at a low logic state SS1=0 (see part c) of FIG. 2). Instead, as shown in part d) of FIG. 2, the second control signal SS2=1 is generated and output by the control unit 7 at a time $\hat{6}$ after the second response time t5'. This occurs during a third period of time t3, wherein the condition t3>t2 applies, as shown in the upper region of FIG. 2. One actuates the second countermeasure for the suppression of the arc discharge through generation and output of the second control signal SS2=1 during the period of time t3 between the time $\hat{6}$ and the time $\hat{7}$ to respond in an appropriate manner to the occurrence of the non self-extinguishing hard arc.

Part b) of FIG. 2 shows the characteristic of the monitoring signal MS (dashed line), which, however, after the point in time $\hat{6}$ is of no particular relevance, for example, for the generation of the control signal SS2.

In FIG. 2, periods of time or time intervals t4, t4' are symbolically represented in part a) by hatched bars. The value or duration of the time intervals t4, t4' (also referred to as fourth periods of time) can be inputted and prescribed via the fourth input port 8d of the control unit 7 as shown in FIG. 1. When prescribing the fourth periods of time t4, t4', one can, for example, ensure that after detection of a voltage drop has taken place, i.e., after detection of an arc discharge and/or of the corresponding response of the monitoring unit 5 as shown in part b) of FIG. 2, no further first control signal SS1 (see part c) of FIG. 4) can be generated up to the conclusion of the time interval t4. Similarly, no further second control signal SS2 (see part c) of FIG. 4) can be generated up to the conclusion of the time interval t4'. In a modification of the example illustrated in FIG. 2, this would, for example, be of relevance if a further voltage drop (not shown in FIG. 2) were to occur only after the time period t1, but before elapse of the period of time t4. Despite the fact that the monitoring signal MS shown in part b) of FIG. 2 would again indicate the detection of an arc discharge and in analogy to the representation in part c), the first control signal SS1 would remain at a low logic state, although in terms of the arc discharge detected one would be dealing with another short arc. This response is caused by the fact that a relevant point in time, for example, the time $\hat{6}$ for triggering the appropriate first countermeasure would still fall within the time interval that is "blocked" according to the period of time t4, so that no first control signal SS1=1 would be generated or outputted. The same applies for the generation of the second control signal SS2 in FIG. 2 with regard to the time t4', although this is not explicitly shown.

By the adjustable prescription of the fourth periods of time t4, t4' within which no response is made to detected short arcs, one can increase the throughput of the relevant plasma process, where the conditions t4>t1, t5 and t4'∝>t1, t5' apply.

Alternatively, the fourth periods of time t4, t4' can also be adjusted or adapted automatically as functions of process parameters of the plasma process PP to achieve an optimal result.

Advantageously, the second period of time t2, during which a response is made to a detected short arc, lies in the range from 0.01 to 10 µs. Thus, the third period of time t3 is greater than the second period of time t2, i.e. t3>t2. For the fourth periods of time t4, t4' the condition applies that t4>t1, t5 and t4'>t1, t5'.

Figure 3:
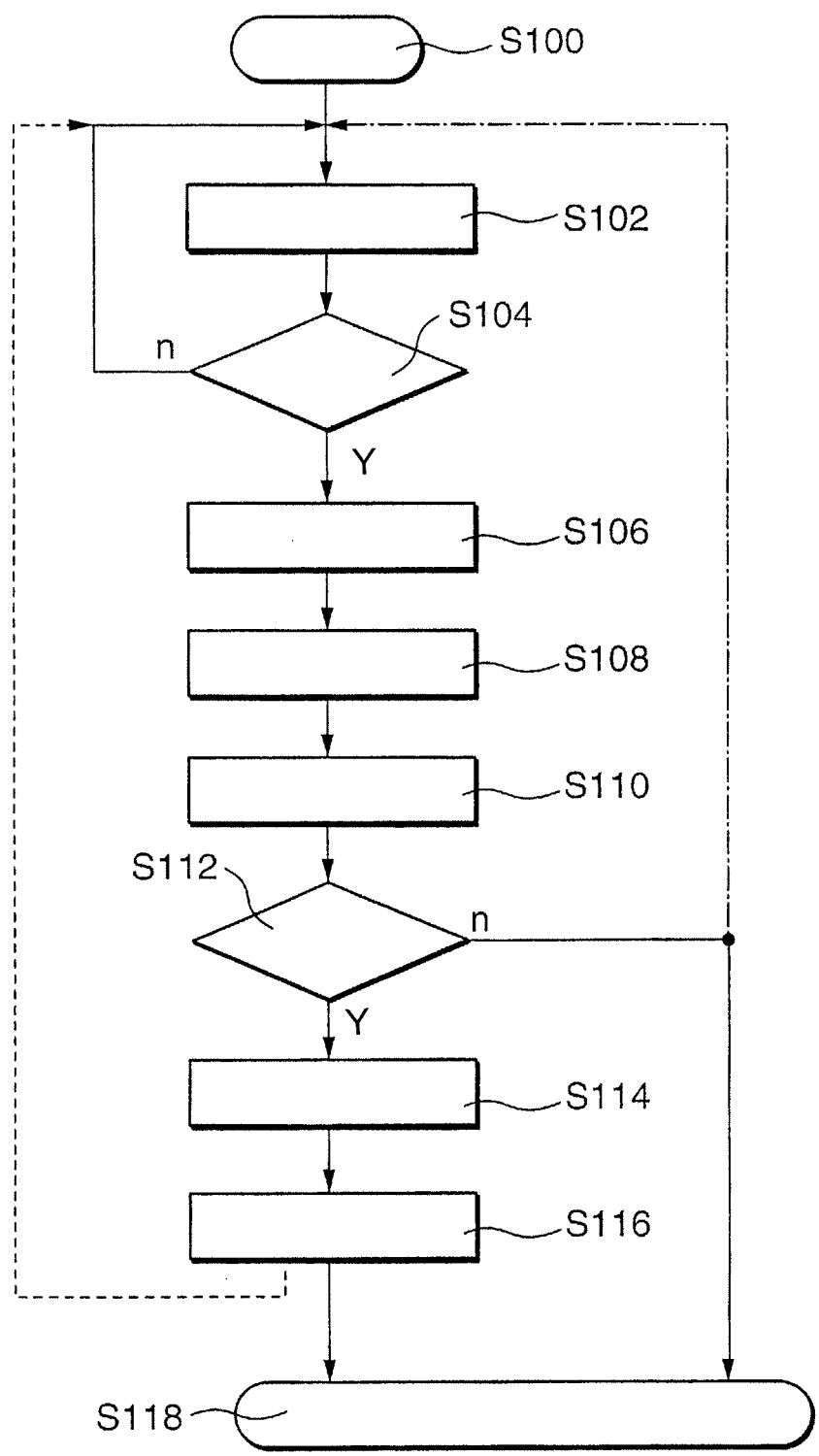
FIG. 3 is a flow chart of an exemplary procedure of the method for responding to arc discharges.

FIG. 3 shows a flow diagram illustrating operation of a plasma process. The operation begins with step a S100. In a next step S102, the monitoring of the electrical parameter takes place, e.g., the voltage, current or power, or an external signal, are monitored as described.

Thereafter a check is made in a step S104 whether the occurrence of an arc discharge can be detected on the basis of the parameter monitored in step S102. If this is not the case (n) the method returns to step S102. If, however, the query in step S104 is answered with yes (y) then during a following step S106 the first response time is allowed to elapse, as described above. Subsequently, the corresponding control signal to actuate the first countermeasure during a prescribed (second) period of time is generated in a step S108 (insofar as a time interval that may have been previously initialized to block responses to a short arc (fourth time interval) is inactive; not represented). Next in a step S110, the conclusion of the delay time is awaited. If—in a following step S112—an arc discharge continues to be detected (y) one is probably dealing with a hard arc, and after allowing the second response time to elapse in a step S114, an appropriate second countermeasure takes place in a step S116 during a prescribed (third) period of time (as long as a time interval that may have been previously initialized to block responses to a hard arc (fourth time interval) is inactive). Examples of countermeasures include an interruption or a reversal in polarity of the plasma power supply. Then, the method ends in a step S118, or continues in the step S102 (dashed line in FIG. 3).

If the query in step S112 is answered with no (n), i.e., the arc discharge is no longer present and no new arc discharge has occurred after conclusion of the delay time, then the method ends immediately with step S118 or continues in step S102 (dotted-dashed line in FIG. 3).

Embodiments of the present invention are applicable to plasma power supplies that deliver DC voltage to a plasma, as described in the examples. In addition, the invention is applicable to plasma power supplies that deliver an AC voltage to the plasma.

In this description, the terms "delay time" or "first period of time", "second period of time", "the third period of time", "fourth period of time" "response time" and "timer unit" are to be construed very broadly and are, for example, defined through a function.

As an alternative to a fixed prescribed period of time, the period of time can also be automatically adjustable, i.e., as a function of the rate of occurrence of the detected short or hard arcs over a defined period of time—as described above. It can also be variable as a function of one or a plurality of external signals that are present at one or a plurality of input ports (not shown) of the plasma power supply, and that can be integrated by the user as an automatic function of his/her measurements or controls. An exemplary signal is a signal that indicates a gas pressure or a type of gas mixture in the plasma process PP and that can be determined via the sensor arrangement 7b of FIG. 1.

In addition to the automatic adjustment of the time, a user may also pre-select a maximum time that is not exceeded, even if the automatic time adjustment would prescribe a longer duration. In addition, a minimum time can be pre-selected that has to pass, even if the automatic time adjustment would prescribe a shorter duration. Adjustments of this kind can also be made by the user via the input ports 8a-8e of the arc discharge detection device 3.

The variety of adjustment options provides a particular advantage because the user has the possibility of better adjusting the arc discharge detection device in many ways to the plasma processes while he maintains at the same time a high throughput and process quality.

With the large number of parameters, which could be adjusted, one may wish to make one or more data sets of particularly advantageous settings available to the user. Then, the user may select in a simple manner. The arc discharge detection device can include for this purpose the already described storage unit 7a for the storage of one or a plurality of sets of pre-set parameters as logical values such that operation is possible without any delay. The parameters define, for example, useful adjustable time periods and threshold values used for the evaluation of the parameter. The arc discharge detection device can include an option for the user to enter such data sets, i.e., to load them and store them when the data sets are, for example, provided via the described input ports 8a-8e in conjunction with the storage medium 7a. For this purpose the storage medium 7a can be designed as a non-volatile store that continues to store the data even if the arc discharge detection device is completely separated from any power supply.

Moreover, one can make one or a plurality of data sets of advantageous settings available to the user. The user can then select in a simple manner. The plasma power source can provide—preferably in the storage medium 7a—one or a plurality of sets of pre-set parameters to operate without any delay, which define the adjustable times and threshold values as logical values. Like the arc discharge detection device described above, the plasma power source can include an option for such data sets to be stored by the user. Advantageously, these data sets can be stored in a non-volatile store that continues to store the data even if the plasma power source is completely separated from any power supply.

Furthermore, there exists the possibility that a user enters periods of time or corresponding values that are illogical or could hinder the plasma power source to work properly, because, e.g., a period of time has been set to be much too small or much too large. This could cause that no signal is available at the output port of the arc discharge detection device. Alternatively, or in addition, the user, when attempting to enter data, which are illogical or which could harm the operation, is provided with a warning message of the possible risks. Thus, in addition to the input, a device may have corresponding output or indication means (not shown) for the warning message. Moreover, settings that are completely illogical can be suppressed in some embodiments. For example, the input may not be permitted, and the control unit 7 may detect but not accept inputs of this kind.

The monitored parameter can be an electrical parameter, as described in connection with the figures. It can, however, also be any other suitable parameter related to the plasma process.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of responding to arc discharges occurring in a plasma process, the method comprising:
    performing operations by a plasma processing device, the operations comprising:
        monitoring a parameter to determine whether an arc discharge is present;
        responsive to determining that an arc discharge is present, executing a first arc countermeasure;
        checking the monitored parameter after a first delay time period associated with the first arc countermeasure to determine whether the arc discharge is still present
        responsive to determining that the arc discharge is still present, executing a second arc countermeasure; and
        responsive to detecting an arc condition during or after execution of the first arc countermeasure, inhibiting execution of any further first arc countermeasures during a first blocked time interval associated with the first arc countermeasure or, responsive to detecting an arc condition during or after execution of the second arc countermeasure, inhibiting execution of any further second arc countermeasures during a second blocked time interval associated with the second arc countermeasure.

2. The method of claim 1, wherein the first delay time period is variable.

3. The method of claim 1, further comprising adjusting the first delay time period based on at least one of an automated adjustment, an adjustment as a function of a process parameter of the plasma process, and an adjustment by a user.

4. The method of claim 1, wherein the first arc countermeasure differs from the second arc countermeasure.

5. The method of claim 1, wherein the first arc countermeasure is executed over a second time period.

6. The method of claim 5, further comprising adjusting at least one of the first delay time period or the second time period by a user.

7. The method of claim 5, further comprising adjusting the second time period automatically as a function of process parameters of the plasma process.

8. The method of claim 5, wherein the second time period is adjustable between about 0.01 and about 10 μs in duration.

9. The method of claim 1, wherein executing the first arc countermeasure includes performing an interruption or a reversal in polarity of a plasma power supply.

10. The method of claim 1, wherein the second arc countermeasure is executed over a third time period.

11. The method of claim 10, further comprising adjusting the third time period by a user.

12. The method of claim 10, further comprising adjusting the third time period automatically as a function of process parameters of the plasma process.

13. The method of claim 10, wherein the third time period is longer than the second time period.

14. The method of claim 10, wherein the third time period is adjustable to be longer than 10 μs.

15. The method of claim 1, wherein executing the second arc countermeasure includes performing an interruption or a reversal in polarity of a plasma power supply.

16. The method of claim 1, in which no arc countermeasures are executed over the first delay time period in response to any further detected arc discharges.

17. The method of claim 1, wherein the execution of any further first arc countermeasures is inhibited during the first blocked time interval and the execution of any further second arc countermeasures is inhibited during the second blocked time interval.

18. The method of claim 1, further comprising controlling the operation of a plasma power supply to change into an arc suppressing operation mode.

19. The method of claim 1, wherein the monitored parameter is an electrical parameter of the plasma process.

20. The method of claim 1, wherein the first arc countermeasure and the second arc countermeasure are executed by different arc discharge extinction circuits.

21. The method of claim 1, wherein the first arc countermeasure and the second arc countermeasure in each case are executed after conclusion of a respective response time period from detection of an arc discharge.

22. A plasma process arc discharge detection device for the detection of arc discharges in a plasma process using at least one parameter, comprising:
    a monitoring unit configured to monitor the at least one parameter of the plasma process and to generate and output a monitoring signal indicating detection of an arc discharge; and
    a control unit configured to initiate a first arc countermeasure based on the monitoring signal;
    wherein the control unit is further configured to initiate a second arc countermeasure based on the monitoring signal after conclusion of a first delay time period following a completion of the first arc countermeasure;
    wherein the plasma process arc discharge detection device is configured to, responsive to detection of an arc condition after the first arc countermeasure is initiated, inhibit execution of any further first arc countermeasures during a first blocked time interval associated with the first arc countermeasure or, responsive to detection of an arc condition after the second arc countermeasure is initiated, to inhibit execution of any further second arc countermeasures during a second blocked time interval associated with the second arc countermeasure.

23. The arc discharge detection device of claim 22, wherein the control unit is configured to adjust the first delay time period during operation based on at least one of an automated adjustment as a function of a process parameter of the plasma process and an adjustment by a user.

24. The arc discharge detection device of claim 22, wherein the control unit is further configured to output a first control signal to control the first arc countermeasure over a second time period.

25. The arc discharge detection device of claim 22, wherein the control unit is configured to output the second control signal over a third time period.

26. The arc discharge detection device of claim 22, wherein the control unit is configured not to output the first control signal during the first blocked time interval and not to output the second control signal during the second blocked time interval.

27. The arc discharge detection device of claim 26, wherein the control unit is configured to adjust the respective periods of time for the first and second arc countermeasures independently of each other.

28. The arc discharge detection device of claim 22, wherein the monitoring unit is configured to monitor an electrical parameter of the plasma process.

29. The arc discharge detection device of claim 22, further comprising separate arc discharge extinction circuits to execute the first and second countermeasures.

30. The arc discharge detection device of claims 22, wherein the control circuit is configured to trigger the first and second arc countermeasures after conclusion of respective variable response time periods from detection of an arc discharge.

31. A plasma power supply comprising:
a power source configured to provide an AC or DC voltage to a plasma process; and
the arc discharge detection device of claim 22 coupled to the power source;
wherein the plasma power supply is controllable by the control unit of the arc discharge detection device.

32. The plasma power supply of claim 31, wherein the plasma power supply is switchable to an off operation mode or is reversible in polarity as a first arc countermeasure in response to a first control signal of the control unit over a second time period.

33. The plasma power supply of claim 31, wherein the plasma power supply is switchable to an off operation mode or is reversible in polarity as a second arc countermeasure in response to a second control signal of the control unit over a third time period.

34. A method of responding to arc discharges occurring in a plasma process, the method comprising:
performing operations by a plasma processing device, the operations comprising:
performing the plasma process;
monitoring a parameter of the plasma process for an arc discharge indication;
responsive to a first indication that an arc discharge is present, executing a first arc countermeasure over a first countermeasure time period;
after completion of the first arc countermeasure, checking the monitored parameter again for an arc discharge indication being present at the conclusion of a first delay time period;
responsive to a second indication that an arc discharge is present, executing a second arc countermeasure over a second countermeasure time period; and
responsive to detecting an arc condition during or after execution of the first arc countermeasure, inhibiting execution of any further first arc countermeasures during a first blocked time interval associated with the first arc countermeasure or, responsive to detecting an arc condition during or after execution of the second arc countermeasure, inhibiting execution of any further second arc countermeasures during a second blocked time interval associated with the second arc countermeasure.

35. The method of claim 34, wherein the first delay time period is variable.

36. The method of claim 34, further comprising adjusting at least one of the first delay time period, the first countermeasure time period, and the second countermeasure time period based on at least one of an automated adjustment, an adjustment as a function of a process parameter of the plasma process, and an adjustment by a user.

37. The method of claim 36, wherein the adjusting is performed during the plasma process.

* * * * *

UNITED STATES PATENT AND TRADEMARK OFFICE
CERTIFICATE OF CORRECTION

| | | |
|---|---|---|
| PATENT NO. | : 8,735,767 B2 | |
| APPLICATION NO. | : 11/956584 | |
| DATED | : May 27, 2014 | |
| INVENTOR(S) | : Moritz Nitschke and Gerhard Zaehringer | |

It is certified that error appears in the above-identified patent and that said Letters Patent is hereby corrected as shown below:

In the Claims

At column 14, line 31 (Claim 16, line 31), delete "arc" and insert --are--.

At column 15, line 33 (Claim 30, line 33), delete "claims" and insert --claim--.

Signed and Sealed this
Seventh Day of April, 2015

Michelle K. Lee
*Director of the United States Patent and Trademark Office*